United States Patent
Yamauchi et al.

(10) Patent No.: US 7,679,968 B2
(45) Date of Patent: Mar. 16, 2010

(54) ENHANCED ERASING OPERATION FOR NON-VOLATILE MEMORY

(75) Inventors: Kazuki Yamauchi, Kanagawa (JP); Junya Kawamata, Kanagawa (JP); Tsutomu Nakai, Kanagawa (JP); Kenji Arai, Kanagawa (JP); Hirokazu Nagashima, Kanagawa (JP); Kenichi Takehana, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 126 days.

(21) Appl. No.: 12/129,530

(22) Filed: May 29, 2008

(65) Prior Publication Data

US 2008/0298136 A1     Dec. 4, 2008

(30) Foreign Application Priority Data

May 29, 2007    (JP)    ............... 2007-142642

(51) Int. Cl.
     *G11C 11/34*      (2006.01)
(52) U.S. Cl. ............... 365/185.29; 365/185.24
(58) Field of Classification Search ............ 365/185.29, 365/185.24
See application file for complete search history.

(56) References Cited

U.S. PATENT DOCUMENTS

| | | | | |
|---|---|---|---|---|
| 2004/0156240 | A1* | 8/2004 | Fujiwara | 365/185.24 |
| 2005/0224893 | A1* | 10/2005 | Arai et al. | 257/390 |
| 2007/0121359 | A1* | 5/2007 | Kanda | 365/51 |
| 2007/0140009 | A1* | 6/2007 | Ito | 365/185.16 |
| 2007/0147128 | A1* | 6/2007 | Edahiro | 365/185.21 |

FOREIGN PATENT DOCUMENTS

| | | |
|---|---|---|
| JP | 10214491 | 8/1998 |
| JP | 11297090 | 10/1999 |
| JP | 2002261240 | 9/2002 |

* cited by examiner

*Primary Examiner*—Michael T Tran (57) ABSTRACT

Structures, methods, and systems for enhanced erasing operation for non-volatile memory are disclosed. In one embodiment, a semiconductor device which comprises a memory cell array having a plurality of non-volatile memory cells, a negative voltage generating circuit for applying a negative voltage to a word line of the memory cell array during an erasing operation of the memory cell array, and a positive voltage generating circuit for applying a positive voltage to a well of the memory cell array when the negative voltage reaches a predetermined voltage.

20 Claims, 6 Drawing Sheets

ENHANCED ERASING OPERATION FOR NON-VOLATILE MEMORY

CLAIM OF PRIORITY

This application claims priority from Japanese patent application 2007-142642 filed on May 29, 2007.

FIELD OF TECHNOLOGY

The present invention relates to nonvolatile memory, and particularly to devices, systems and methods for erasing operation of the non-volatile memory.

BACKGROUND

Figure 1:
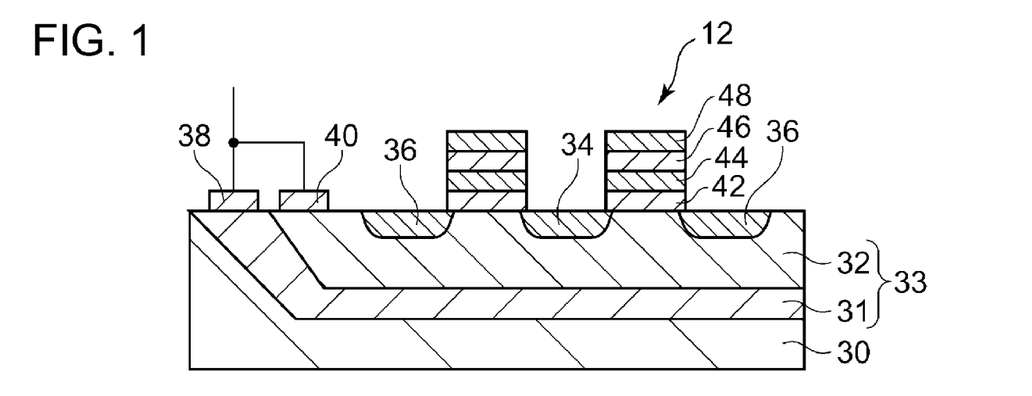
FIG. 1 is a cross-sectional view illustrating a conventional nonvolatile memory cell.

Recently, rewritable non-volatile memories have been widely used for many electronic devices such as mobile phone terminals and digital cameras. FIG. 1 is a view illustrating a cross-section of a non-volatile memory cell 12 having a floating gate as a charge storage layer. In FIG. 1, an n-type well 31 is formed in a semiconductor substrate 30, and a p-type well 32 is formed on the n-type well 31. A well 33 is composed of the n-type well 31 and the p-type well 32. An n-type source region 34 and a drain region 36 are formed on the p-type well 32. A tunnel oxide film 42, a floating gate 44, an insulating film 46, and a control gate 48 are formed on the p-type well 32 between the source region 34 and the drain region 36. The control gate 48 is connected to a word line (not shown). An n-electrode 38 for applying a voltage to the n-type well 31 is formed and connected to the n-type well 31. A p-electrode 40 for applying a voltage to the p-type well 32 is formed and connected to the p-type well 32.

When a writing operation to the memory cell 12 is performed by accumulating a charge in the floating gate 44, an electric field is applied between the source region 34 and the drain region 36. A positive electric potential is applied to the well 33 via the control gate 48 and the word line. Thereby, hot electrons are injected into the floating gate 44, and a charge is accumulated in the floating gate 44. On the other hand, when an erasing operation is performed to the memory cell 12, that is, when the charge is erased from the floating gate 44, a negative electric potential is applied to the well 33 via the control gate 48 and the word line. Thereby, due to a Fowler-Nordheim tunneling phenomenon, electrons in the floating gate 44 tunnel to the p-type well 32 through the tunnel oxide film 42, thus erasing the charge in the floating gate 44.

Figure 2:
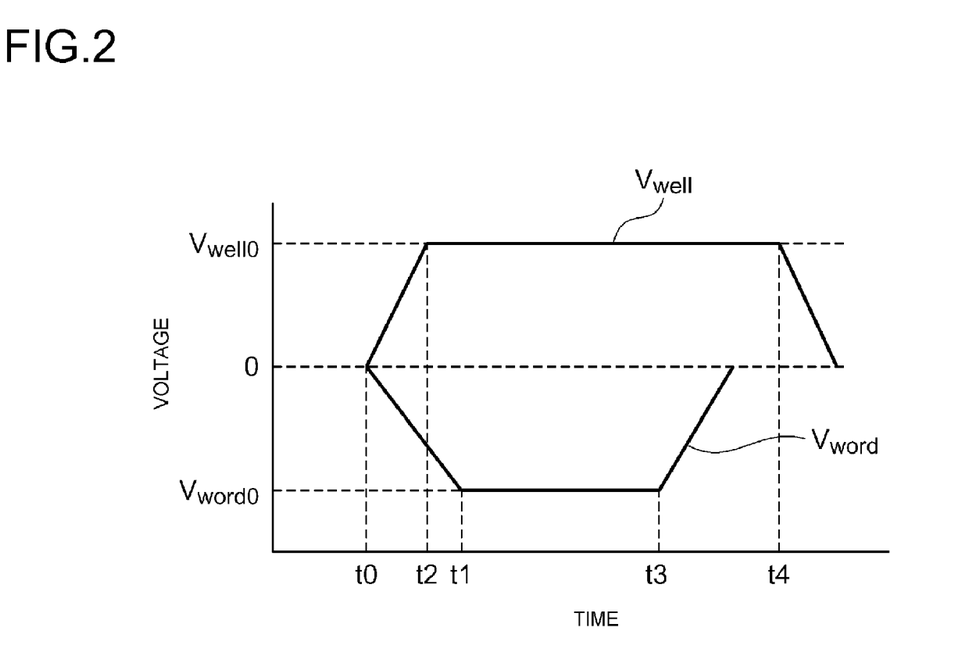
FIG. 2 is a timing chart of a well voltage and a word line voltage during an ideal erasing operation of a nonvolatile memory cell.

FIG. 2 is a timing chart of a voltage Vwell of the well 33 (e.g., the n-type well 31 and the p-type well 32) and a voltage Vword of the word line (control gate) during the erasing operation. At t0, erasing of the memory cell 12 starts. The word line voltage Vword of a selected word line gradually increases in a negative direction. The well voltage Vwell gradually increases in a positive direction. At t1, the word line voltage Vword becomes a constant voltage Vword0. At t2, the well voltage Vwell becomes a constant voltage Vwell0. When the erasing of the memory cell 12, which is connected to the selected word line, is completed at t3 or later, the word line voltage Vword gradually becomes 0. At t4 or later, the well voltage Vwell gradually becomes 0.

Figure 3:
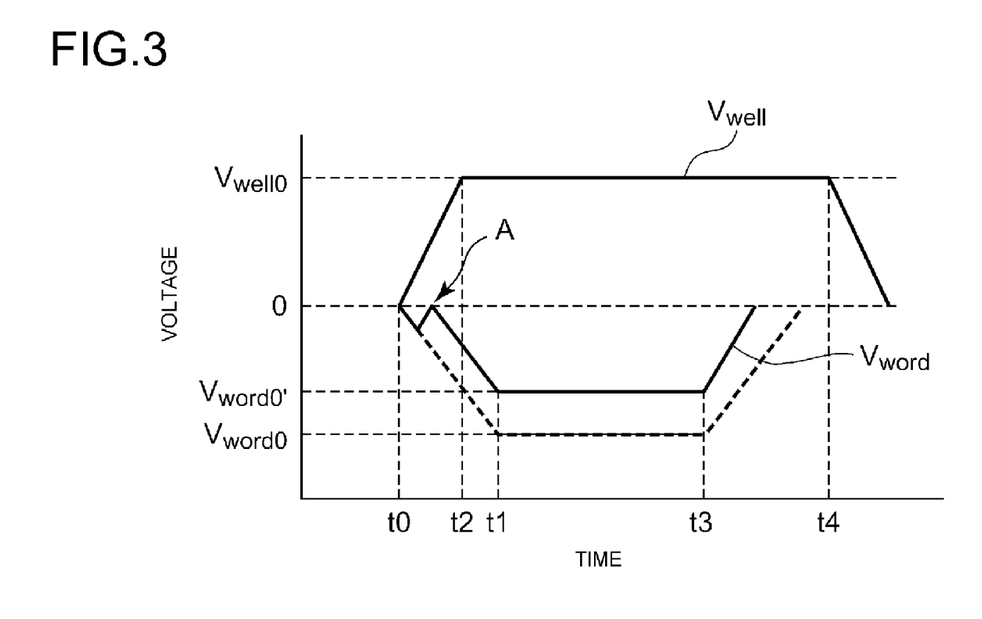
FIG. 3 is a timing chart of the well voltage and the word line voltage during an erasing operation of the conventional memory cell of FIG. 1.

However, between t0 and t2, the word line voltage Vword may be raised to 0V as in point A of FIG. 3 rather than being continually decreased. This may be due to capacitive coupling between the well 33 and the word line WL arranged on the well 33. Since the well 33 is commonly provided in many memory cells 12, an electrostatic capacitance (parasitic capacitance) of the well 33 is extremely large compared to that of the word line WL. Accordingly, the word line voltage Vword may be raised when the well 33 is charged. Due to the rise of the word line voltage Vword, the word line voltage Vword may not reach the constant voltage Vword0 at t1, which is the voltage that the word line voltage Vword is supposed to reach. Instead, word line voltage Vword may be kept constant at a voltage Vword0' at t1. The disruption of the potential between the well voltage Vwell and the word line voltage Vword due to the capacitive coupling may delay and/or disrupt the erasing operation of the memory cell 12.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

One embodiment of the present invention is directed to A semiconductor device which comprises a memory cell array having a plurality of non-volatile memory cells, a negative voltage generating circuit for applying a negative voltage to a word line of the memory cell array during an erasing operation of the memory cell array, and a positive voltage generating circuit for applying a positive voltage to a well of the memory cell array when the negative voltage reaches a predetermined voltage.

As illustrated in the detailed description, other embodiments pertain to structures, methods, and systems that enable an enhanced erasing operation of the nonvolatile memory. By applying the positive voltage to the well of the memory cell array some time after the negative voltage is applied to the word line of the memory cell array, the capacitive coupling of the well and the word line can be delayed. Thus, the negative voltage is able to reach the predetermined voltage for efficient erasing operation of the memory cell array by the time the positive voltage is applied to the well. More stable negative voltage applied to the word line according to this scheme enables a faster and more effective erasing operation of the memory cell array.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, embodiments pertain to structures, methods, and systems that enable an enhanced erasing operation for nonvolatile memory. By applying a positive voltage to a well of a memory cell array of the nonvolatile memory some time after a negative voltage is applied to a word line of the memory cell array, the capacitive coupling of the well and the word line can be delayed. As a result, the negative voltage is able to reach the predetermined voltage for efficient erasing operation of the memory cell array by the time the positive voltage is applied to the well.

Figure 4:
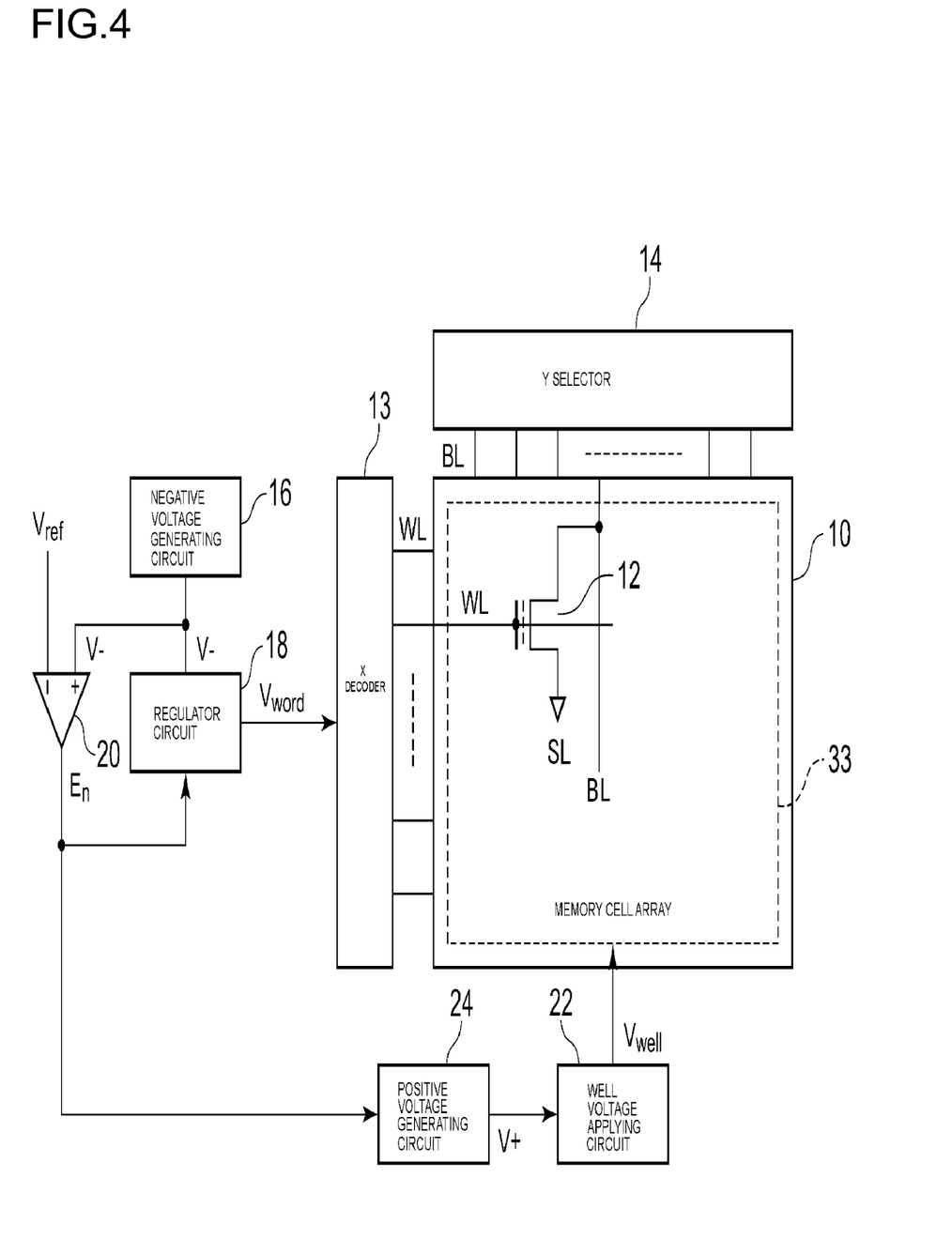
FIG. 4 is a block diagram of an exemplary nonvolatile memory system, according to one embodiment.

FIG. 4 is a block diagram of an exemplary nonvolatile memory system, according to one embodiment. In reference to FIG. 4, the non-volatile memory includes a memory cell array 10, an X decoder 13, which is the first voltage applying section, a Y selector 14, a negative voltage generating circuit 16, a regulator circuit 18, a comparator 20, a well voltage applying circuit 22, which is the second voltage applying section, and a positive voltage generating circuit 24. The memory cell array 10 has a plurality of non-volatile memory cells 12. The plurality of memory cells 12 are arranged in a matrix. A control gate of each memory cell 12 is connected to a word line WL, a drain is connected to a bit line BL, and a source is connected to a source line SL. A structure of the memory cell 12 is the same as the structure shown in FIG. 1. The X decoder 13 and the Y selector 14 respectively select the word line WL and the bit line BL, to select the memory cell 12 to write, erase or read.

The negative voltage generating circuit 16, which is a booster circuit, generates a negative voltage V− to be applied to the word line WL during the erasing operation. The regulator circuit 18 maintains the negative voltage V− at a constant voltage when an operating signal En is the input. The comparator 20 compares the negative voltage V− and a reference voltage Vref, and generates the operating signal En to the regulator circuit 18 when the negative voltage V− becomes Vref or less. Accordingly, the regulator circuit 18 maintains the negative voltage V− at a voltage related to the reference voltage Vref, and forwards the voltage to the X decoder 13. The voltage output by the regulator circuit 18 is applied as the word line voltage Vword to the word line WL selected by the X decoder 13.

The positive voltage generating circuit 24, which is another booster circuit, generates a positive voltage V+ applied to a well 33 during the erasing operation. It is appreciated the well 33 in FIG. 3 is similar to the well 33 of FIG. 3 in its function and structure. The well voltage applying circuit 22 applies the positive voltage V+ to the well 33 of the memory cell array 10 as the well voltage Vwell.

Figure 5:
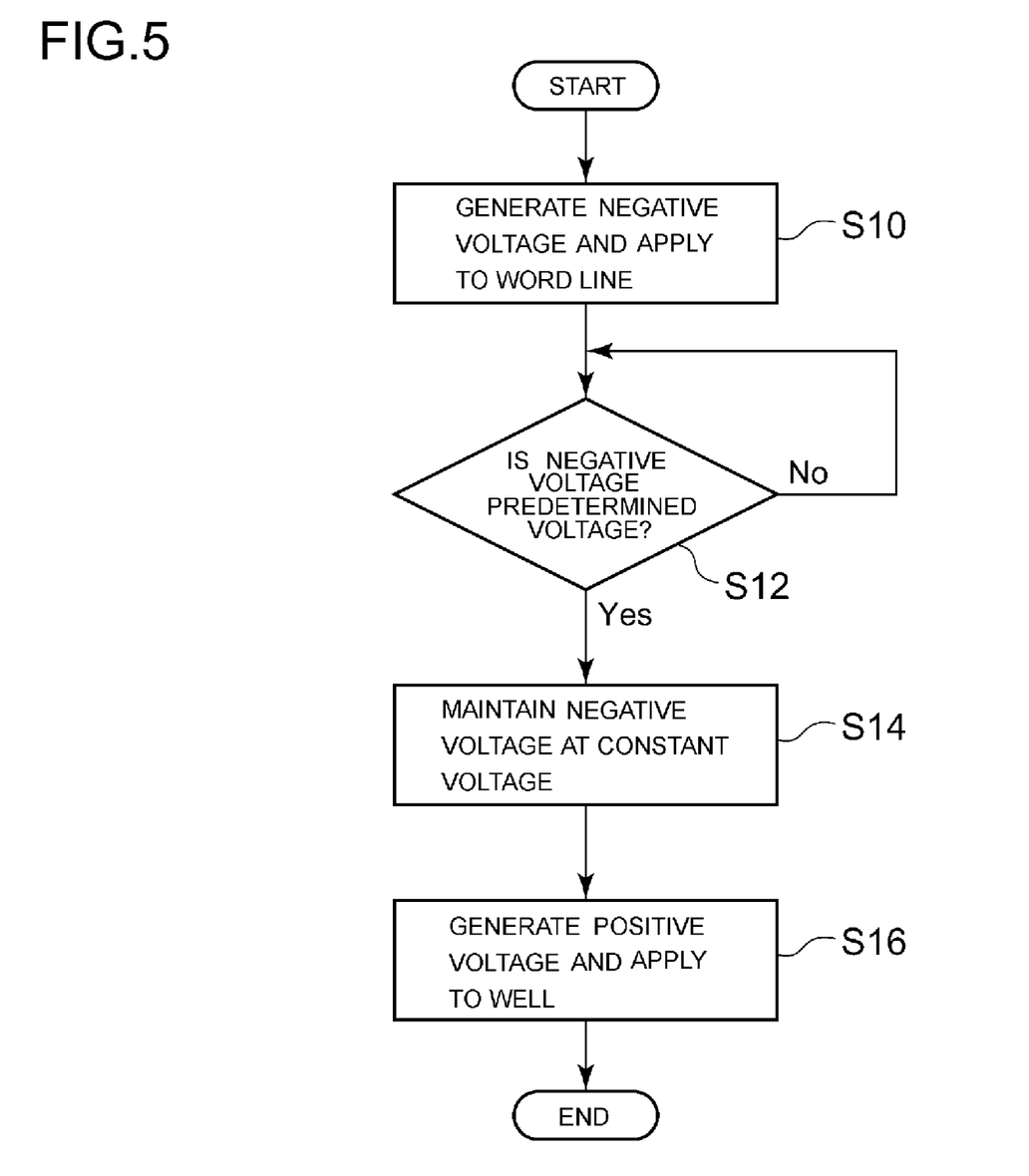
FIG. 5 is a flow chart illustrating an exemplary operation of the non-volatile memory of FIG. 4, according to one embodiment.
Figure 6:
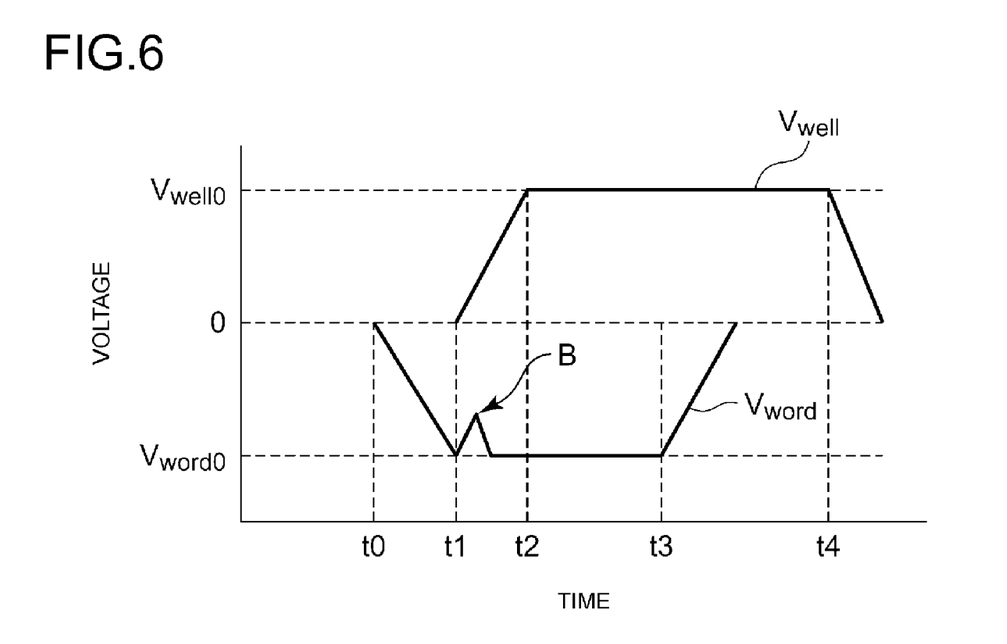
FIG. 6 is a timing chart of the voltage Vwell of the well and the word line voltage Vword in FIG. 3, according to one embodiment.

FIG. 5 is a flow chart illustrating an exemplary operation of the non-volatile memory of FIG. 4, according to one embodiment. FIG. 6 is a timing chart of the voltage Vwell of the well 33 and the word line voltage Vword in FIG. 3, according to one embodiment. In reference to FIG. 5 and FIG. 6, the operation of the non-volatile memory according to the embodiment will be described. At time t0 in FIG. 6, the negative voltage generating circuit 16 generates the negative voltage V−. The X decoder 13 selects the word line WL, and applies the negative voltage V− as the word line voltage Vword to the selected word line WL (step S10). Accordingly, during a period from time t0 to time t1 in FIG. 6, the word line voltage Vword linearly decreases.

In step S12 of FIG. 5, the comparator 20 compares the negative voltage V− and the reference voltage Vref, and determines whether the negative voltage V− is equal to or below the predetermined voltage (e.g., Vref, Vword0, etc.). If the negative voltage V− is less than the predetermined voltage, the comparator 20 does not output the operating signal En. Therefore, the magnitude of the negative voltage V− continues to increase. In step S12 of FIG. 5, when the word line voltage Vword becomes a constant voltage Vword0 at time t1, the comparator 20 forwards the operating signal En to the regulator circuit 18 and the positive voltage generating circuit 24. That is, the comparator 20 determines that the negative voltage V− is equal to the predetermined voltage.

Accordingly, in step S14, the regulator circuit 18 maintains the negative voltage V− constant. In addition, at time t1 in FIG. 6, the word line voltage Vword is maintained constant at the voltage Vword0. Furthermore, the positive voltage generating circuit 24 starts its operation. It is appreciated that there is a timing gap between the start of the generating or applying the negative voltage by the negative voltage generating circuit and the start of the generating or applying the positive voltage by the positive voltage generating circuit. In step S16, the well voltage applying circuit 22 applies a positive voltage to the well 33. From time t1 to time t2 in FIG. 6, the well voltage Vwell increases. When the erasing operation for the memory cell 12 connected to the selected word ling WL completes, the operation of the negative voltage generating circuit 16 is completed at time t3. Furthermore, at time t4, the positive voltage generating circuit 24 ends its operation.

According to the embodiment, as in step S10 of FIG. 5, the X decoder 13, which is the first voltage applying section, applies a negative voltage to the word line WL of the memory cell array 10 during the erasing operation. As in step S16, when the negative voltage, which is the word line voltage Vword, reaches the constant voltage Vword0, the well voltage applying circuit 22 applies a positive voltage (e.g., well voltage Vwell) to the well 33 of the memory cell array 10.

Accordingly, as shown at B in FIG. 6, the rise of the word line voltage Vword due to capacitive coupling of the well 33 and the word line WL occurs after time t1. Thus, the word line voltage Vword increases only after the word line voltage Vword is sufficiently dropped. Accordingly, it is possible to prevent the word line voltage Vword from rising close to or above 0V as illustrated in FIG. 3 (See point A). Thereby, it is possible to prevent a phenomenon that the word line voltage Vword at the constant voltage Vword0' being insufficiently negative as described with reference to FIG. 3.

The predetermined voltage may be a voltage other that the constant voltage Vword0 as long as the voltage prevents the word line voltage Vword from rising close to or above 0V. However, as in the embodiment, it is preferable that the regulator circuit 18 maintains the negative voltage V− at the constant voltage Vword0. Accordingly, by coinciding the timing of the regulator circuit 18 maintaining the voltage at the constant voltage with the timing of the well voltage applying circuit 22 applying a positive voltage to the well 33, it is possible to prevent the word line voltage Vword from rising close to or above 0V.

As shown in FIG. 4 and FIG. 6 illustrating the embodiment, it is preferable to provide the comparator 20 that compares the negative voltage V− and the reference voltage Vref, and outputs the operating signal En based to the result of comparison. It is also preferable that the regulator circuit 18 maintains the negative voltage V− at the predetermined voltage Vword0 based on the operating circuit En. Furthermore, it is preferable that the well voltage applying circuit 22 apply a positive voltage to the well 33 based on the operating signal En. Accordingly, by using the operating signal En that operates the regulator circuit 18 at a timing of applying the positive voltage to the well 33, it is possible to omit a circuit in the structure.

In the embodiment, an example of a non-volatile memory utilizing a floating gate as a charge storage layer is explained. However, the present invention may be applied in a non-volatile memory utilizing an insulating layer such as a silicon nitride film as a charge storage layer.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A semiconductor device comprising:
   a memory cell array having a plurality of non-volatile memory cells;
   a negative voltage generating circuit for applying a negative voltage to a word line of the memory cell array during an erasing operation of the memory cell array; and
   a positive voltage generating circuit for applying a positive voltage to a well of the memory cell array when the negative voltage reaches a predetermined voltage, wherein there is a timing gap between a start of the applying the negative voltage and a start of the applying the positive voltage.

2. The semiconductor device according to claim 1, further comprising a regulator circuit that maintains the negative voltage applied to the word line at or below the predetermined voltage.

3. The semiconductor device according to claim 2, further comprising a comparator that performs a comparison between the negative voltage and a reference voltage and forwards an operating signal based on the comparison, wherein the regulator circuit maintains the negative voltage at or below the predetermined voltage based on the operating signal.

4. The semiconductor device according to claim 3, wherein the applying the positive voltage to the well is initiated when the operating signal is received by the positive voltage generating circuit.

5. The semiconductor device according to claim 3, wherein the predetermined voltage is the reference voltage.

6. The semiconductor device according to claim 1, further comprising a well voltage applying circuit coupled to the positive voltage generating circuit for applying the positive voltage to the well.

7. The semiconductor device according to claim 1, wherein the applying the positive voltage is performed after the applying the negative voltage by a threshold time.

8. The semiconductor device according to claim 7, wherein the threshold time enables the negative voltage to reach the predetermined value by delaying a capacitive coupling between the word line and the well by the threshold time since the applying of the negative voltage.

9. A method for controlling a semiconductor device, comprising:
   applying a negative voltage to a word line of a memory cell array during an erasing operation of the memory cell array having a plurality of non-volatile memory cells; and
   applying a positive voltage to a well of the memory cell array when the negative voltage reaches a predetermined voltage,
   wherein there is a timing gap between a start of the applying the negative voltage and a start of the applying the positive voltage.

10. The method according to claim 9, wherein the applying the positive voltage is performed a duration after the applying the negative voltage.

11. The method according to claim 10, wherein the duration enables the negative voltage to reach the predetermined voltage.

12. The method according to claim 9, the applying the positive voltage to the well of the memory cell when the negative voltage reaches the predetermined value suppress a capacitive coupling of the word line and the well until the negative voltage reaches the predetermined value.

13. The method of according to claim 9, wherein the negative voltage is maintained at the predetermined voltage when the negative voltage reaches the predetermined voltage.

14. A system for suppressing a capacitive coupling of a word line and a well associated with a memory cell array in a nonvolatile memory device, comprising:
   a negative voltage generating circuit for applying a negative voltage to the word line during an erasing operation of the memory cell array; and
   a positive voltage generating circuit for applying a positive voltage to the well when the negative voltage reaches a predetermined voltage,
   wherein there is a timing gap between a start of the applying the negative voltage and a start of the applying the positive voltage.

15. The system according to claim 14, further comprising a regulator circuit that maintains the negative voltage applied to the word line at or below the predetermined voltage.

16. The system according to claim 15, further comprising a comparator that performs a comparison between the negative voltage and a reference voltage and forwards an operating signal based on the comparison, wherein the regulator circuit maintains the negative voltage at or below the predetermined voltage based on the operating signal.

17. The system according to claim 16, wherein the applying the positive voltage to the well is initiated when the operating signal is received by the positive voltage generating circuit.

18. The system according to claim 14, further comprising a well voltage applying circuit coupled to the positive voltage generating circuit for applying the positive voltage to the well.

19. The system according to claim 14, wherein the applying the positive voltage is performed after the applying the negative voltage by a threshold time.

20. The system according to claim 19, wherein the threshold time enables the negative voltage to reach the predetermined value by delaying a capacitive coupling between the word line and the well by the threshold time since the applying of the negative voltage.

* * * * *